(12) United States Patent
Ma et al.

(10) Patent No.: US 7,538,396 B2
(45) Date of Patent: May 26, 2009

(54) SEMICONDUCTOR DEVICE AND COMPLEMENTARY METAL-OXIDE-SEMICONDUCTOR FIELD EFFECT TRANSISTOR

(75) Inventors: Shih-Kuei Ma, Hsinchu (TW); Chung-Yeh Lee, Hsinchu (TW); Chun-Ying Yeh, Hsinchu (TW); Wei-Ting Kuo, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 84 days.

(21) Appl. No.: 11/624,693

(22) Filed: Jan. 19, 2007

(65) Prior Publication Data
US 2008/0173948 A1 Jul. 24, 2008

(51) Int. Cl.
*H01L 27/092* (2006.01)
(52) U.S. Cl. .................. 257/371; 257/343; 438/223
(58) Field of Classification Search .................. 437/33; 438/213, 207, 355; 257/373, 552
See application file for complete search history.

(56) References Cited

U.S. PATENT DOCUMENTS

| | | | |
|---|---|---|---|
| 3,649,887 A | 3/1972 | Keller et al. | |
| 3,931,634 A | 1/1976 | Knight | |
| 4,027,365 A | 6/1977 | Froeliger | |
| 4,466,011 A | 8/1984 | Van Zanten | |
| 4,890,149 A | 12/1989 | Bertotti et al. | |
| 5,021,860 A | 6/1991 | Bertotti et al. | |
| 5,243,214 A | 9/1993 | Sin et al. | |
| 5,495,123 A | 2/1996 | Canclini | |
| 5,648,281 A * | 7/1997 | Williams et al. | 438/358 |

* cited by examiner

*Primary Examiner*—N Drew Richards
*Assistant Examiner*—Mamadou Diallo
(74) *Attorney, Agent, or Firm*—Jianq Chyun IP Office

(57) ABSTRACT

A semiconductor device includes a substrate, an epitaxial layer, a sinker, an active device, a first buried layer, and a second buried layer. The substrate has a first type conductivity. The epitaxial layer has a second type conductivity, and is located on the substrate. The sinker has the second type conductivity, and is located in the epitaxial layer. The sinker extends from the substrate to an upper surface of the epitaxial layer, and partitions a region off from the epitaxial layer. The active device is located within the region. The first buried layer has the first type conductivity, and is located between the region and the substrate. The second buried layer has the second type conductivity, and is located between the first buried layer and the substrate. The second buried layer connects with the sinker. Because of the above-mentioned configuration, latch-up can be prevented.

6 Claims, 3 Drawing Sheets

SEMICONDUCTOR DEVICE AND COMPLEMENTARY METAL-OXIDE-SEMICONDUCTOR FIELD EFFECT TRANSISTOR

BACKGROUND OF THE INVENTION

1. Field of the Invention

The present invention generally relates to a semiconductor device, and more particularly, to a semiconductor device which can prevent a latch-up phenomenon.

2. Description of Related Art

Semiconductor design must be improved along with increasing integration and increasing complicated requirements thereof. For example, the design of high voltage devices must enable the devices to operate under a high voltage without effecting operation of other devices. Restriction and problem of a high voltage device are described as follows with reference to FIG. 1.

FIG. 1 is a cross-sectional view showing a conventional high voltage device. This high voltage device is a complementary metal-oxide-semiconductor field effect transistor (CMOSFET) that is composed of two lateral double-diffused metal-oxide-semiconductor field effect transistors (LDMOSFET).

With reference to FIG. 1, the high voltage device comprises a P-type substrate 100, gates 102 and 104, gate dielectric layers 105 and 108, a P-well 112$p$, a P-tub 114$p$, doped regions 116$p$, 118$p$ and 120$p$, N-tubs 122$n$ and 124$n$, doped regions 126$n$, 128$n$ and 130$n$, an isolation structure 134, a dielectric layer 136, interconnects 138, and a dielectric layer 140. The P-type substrate 100 may be divided as a region of HVNMOSFET and a region of HVPMOSFET containing an high voltage N-type metal-oxide-semiconductor field effect transistor (hereinafter referred to as N-type MOSFET) and a high voltage P-type metal-oxide-semiconductor field effect transistor (hereinafter referred to as high voltage P-type MOSFET), respectively. The doped regions 126$n$, 128$n$ and the gate 102 form respective source, drain and gate of the high voltage N-type MOSFET, and the doped regions 120$p$, 118$p$ and the gate 104 form respective source, drain and gate of the high voltage P-type MOSFET. The doped regions 116$p$, 118$p$ and 120$p$ have a P+-type conductivity, and the doped regions 126$n$, 128$n$ and 130$n$ have an N+-type conductivity.

The high voltage device as shown in FIG. 1 has the following shortcomings:

1. The high voltage device may leads to a latch-up phenomenon. Specifically, the doped regions 120$p$, N-tub 124$n$ and P-type substrate 100 constitute the emitter, base and collector of a parasitic bipolar transistor, the doped regions 126$n$, P-type substrate 100 and N-tub 124$n$ constitute the emitter, base and collector of another parasitic bipolar transistor. Once a product of current gains of the two parasitic bipolar transistors is greater than "1," the high voltage device can not operate normally.

2. The high voltage P-type MOSFET and high voltage N-type MOSFET are formed on the P-type substrate 100. An input voltage applied to the doped region 120$p$ will be directly applied to the P-type substrate 100. Therefore, the input voltage is subject to a great restriction, resulting in a narrowed operation voltage range of the high voltage device.

3. The P-type substrate 100 usually includes other semiconductor devices formed thereon. However, the high voltage device has no isolation structures formed at two sides thereof. As a result, the high voltage device and these other semiconductor devices may interfere with each other. Therefore, the operation of any semiconductor device can possibly effect the operation of any others. It is thus desired to provide an improved solution addressing the above-mentioned shortcomings and problems.

SUMMARY OF THE INVENTION

Accordingly, the present invention is directed to a semiconductor device which can solve the problem of the narrow input voltage range, and prevent interference with other semiconductor devices.

The present invention is also directed to a complementary metal-oxide-semiconductor field effect transistor which can prevent latch-up thereof.

The semiconductor device comprises a substrate, an epitaxial layer, a sinker, an active device, a first buried layer and a second buried layer. The substrate has a first type conductivity. The epitaxial layer has a second type conductivity, and is formed on the substrate. The sinker has the second type conductivity, and is formed in the epitaxial layer. The sinker extends from the substrate to an upper surface of the epitaxial layer, and partitions a region off from the epitaxial layer. The active device is located within the region. The first buried layer has the first type conductivity, and is located between the region and the substrate. The second buried layer has the second type conductivity, and is located between the first buried layer and the substrate. The second buried layer connects with the sinker.

According to one embodiment of the present invention, the semiconductor device further comprises a third buried layer of the first type conductivity. The third buried layer is located between the second buried layer and the substrate. A doping concentration of the third buried layer is greater than that of the substrate.

In an embodiment of the present invention, a doping concentration of the first buried layer is greater than that of the substrate.

In an embodiment of the present invention, the active device is a high voltage metal-oxide-semiconductor field effect transistor.

In an embodiment of the present invention, the first conductivity type is P-type, and the second conductivity type is N-type. In another embodiment of the present invention, the first conductivity type is N-type, and the second conductivity type is P-type.

The complementary metal-oxide-semiconductor field effect transistor comprises a substrate, an epitaxial layer, a first sinker, a second sinker, a well region, a first transistor, a second transistor, a first buried layer and a second buried layer. The substrate has a first type conductivity. The epitaxial layer has a second type conductivity, and is formed on the substrate. The first sinker has the second type conductivity, and is formed in the epitaxial layer. The first sinker extends from the substrate to an upper surface of the epitaxial layer, and partitions a first region off from the epitaxial layer. The second sinker has the second type conductivity, and is formed in the epitaxial layer. The second sinker extends from the substrate to the upper surface of the epitaxial layer, and partitions a second region off from the epitaxial layer outside the first region. The well region has the first type conductivity, and is located within the first region. The first transistor is located within the well region, and the second transistor is located in the second region. The first buried layer has the first type conductivity, and is located between the first region and the substrate. The second buried layer has the second type conductivity, and is located between the first buried layer and the substrate. The second buried layer is located between the second region and the substrate. The second buried layer between the first buried layer and the substrate connects with the first sinker, and the second buried layer between the second region and the substrate connects with the second sinker.

According to one embodiment of the present invention, the complementary metal-oxide-semiconductor field effect transistor further comprises a third buried layer. The third buried layer has the first type conductivity, and is located below the first buried layer and between the second buried layer and the substrate. In addition, a doping concentration of the third buried layer is greater than that of the substrate.

In an embodiment of the present invention, a doping concentration of the third buried layer is greater than that of the substrate.

In an embodiment of the present invention, the first transistor and the second transistor are high voltage metal-oxide-semiconductor field effect transistors.

In an embodiment of the present invention, the first conductivity type is P-type, and the second conductivity type is N-type. In another embodiment of the present invention, the first conductivity type is N-type, and the second conductivity type is P-type.

The present invention can prevent latch-up of the complementary metal-oxide-semiconductor field effect transistor, widen the input voltage range, and provide isolation from other semiconductor devices on the substrate.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated embodiments of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

To overcome the shortcomings of the conventional semiconductor device, the semiconductor device of the present invention is located in an epitaxial layer on the substrate. Specifically, the epitaxial layer and the substrate have opposite conductivity types and can therefore provide a diode rectifier function, thereby preventing excessive carrier injecting into the substrate. In addition, between the epitaxial layer and the substrate are provided with two buried layers, and exterior electrical connection of the buried layers is provided via a sinker. With the provision of the buried layers, the structure of the parasitic diode or parasitic transistor can be changed. Furthermore, since the buried layers are provided, adjusting voltage of the buried layers can prevent the input voltage applied to the semiconductor device from being totally applied to the substrate. This can widen the operation voltage range of the high voltage device. In addition, the above mentioned structure can effectively prevent latch-up. The above mentioned structure will be described in detail by the following first and second embodiments.

First Embodiment

Figure 1:
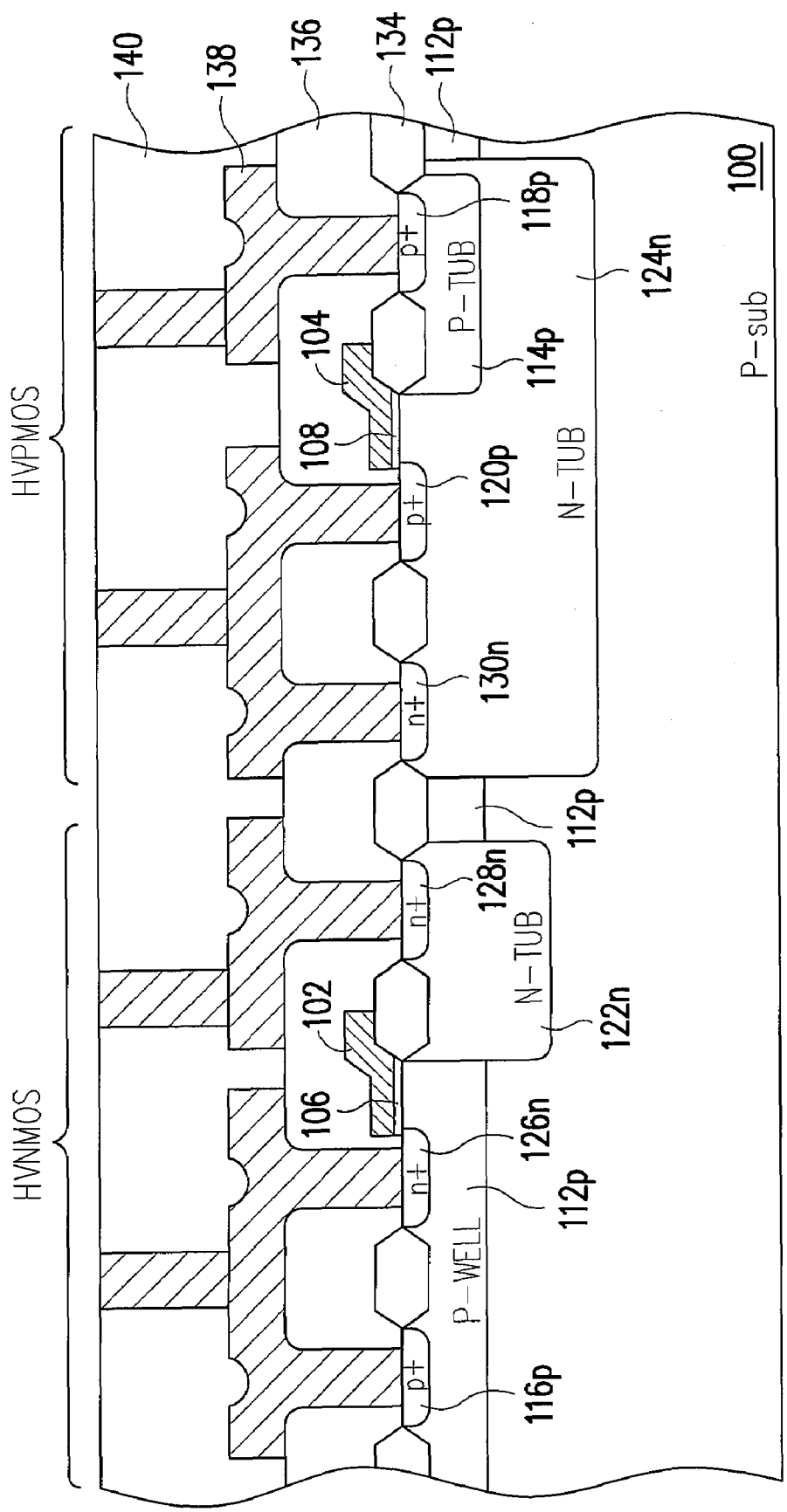
FIG. 1 is a cross-sectional view of conventional high voltage device.
Figure 2:
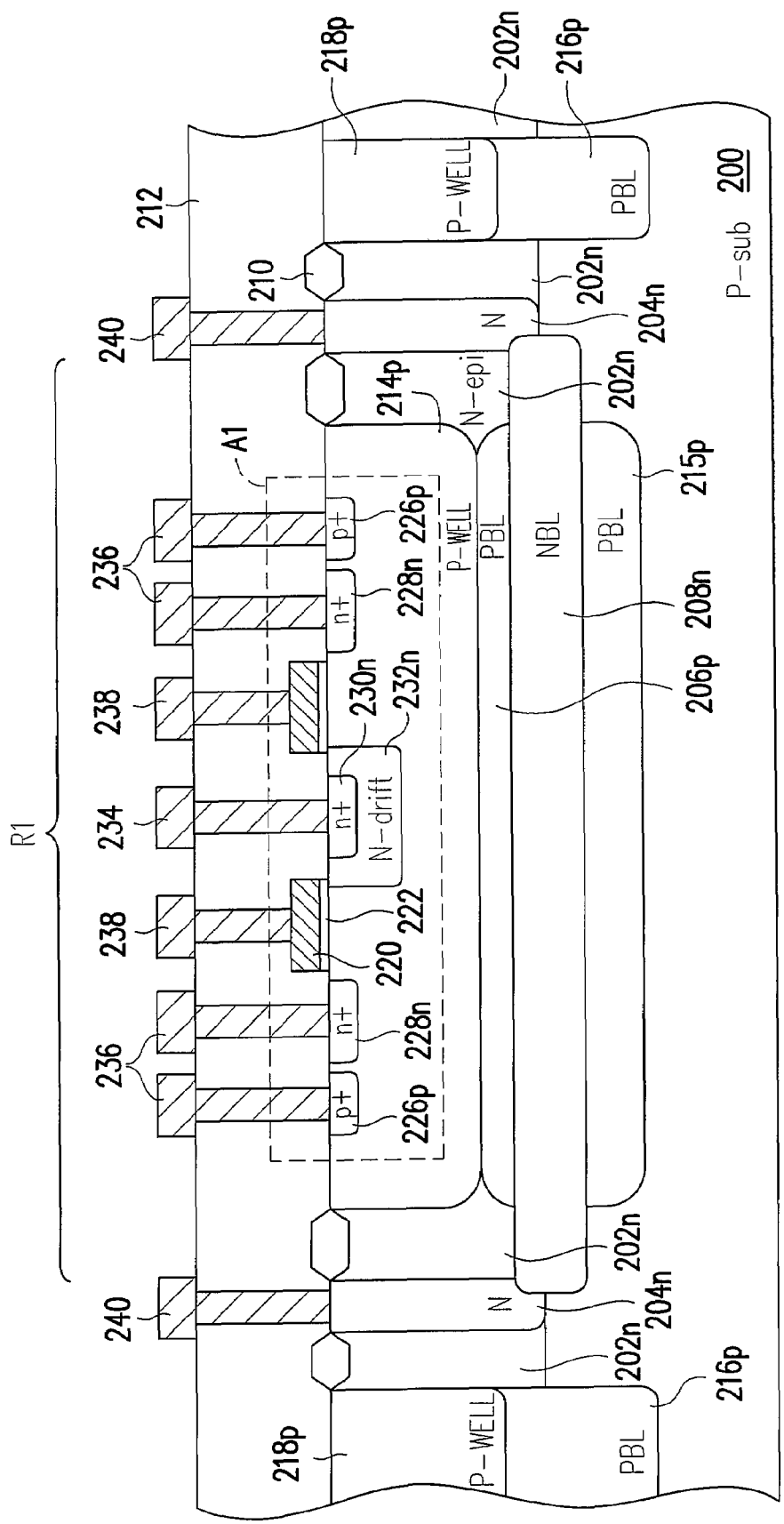
FIG. 2 is a cross-sectional view of a semiconductor device in accordance with a first embodiment of the present invention.

FIG. 2 is a cross-sectional view of a semiconductor device in accordance with a first embodiment of the present invention.

Referring to FIG. 2, the semiconductor device of the present invention includes a substrate 200, an epitaxial layer 202n, a sinker 204n, an active device A1, a first buried layer 206p and a second buried layer 208n. In this embodiment, the semiconductor device further includes an isolation structure 210, a dielectric layer 212, a well region 214p, a buried layer 216p, a well region 218p, interconnects 234, 236, 238 and 240, but the present invention is not limited to the particular embodiment disclosed herein. The active device A1 may be any suitable type of active devices, for example, a high voltage metal-oxide-semiconductor field effect transistor (hereinafter referred to as MOSFET) including a lateral double-diffused metal-oxide-semiconductor field effect transistors (LDMOSFET). In this embodiment, the active device A1 takes another MOSFET an example. The active device A1 includes a gate 220, a gate dielectric layer 222, and doped regions 226p, 228n, 230n and 232n. In addition, as shown in FIG. 2, the conductivity types of the above described components are represented by labels such as P-sub, N-epi, N, PBL, NBL, P-Well, n+, p+, N-drift and the like. This is for the ease of understanding by those skilled in the art, and should not be used to limit the present invention. In other words, in another alternative embodiment, the above described components can have opposite type conductivity. Furthermore, in this embodiment, a first conductivity type is P-type, and a second conductivity type is N-type. In another alternative embodiment, the first conductivity type is N-type, and the second conductivity type is P-type.

The substrate 200 has the first type conductivity. The epitaxial layer 202n has the second type conductivity and is formed on the substrate 200. The epitaxial layer 202n and substrate 200 cooperatively form a diode. During operation of the active device A1, rectifier function of the diode can prevent the carrier injection into the substrate 200. The sinker 204n has the second type conductivity. The sinker 204n is formed in the epitaxial layer 202n, and extends from the substrate 200 to an upper surface of the epitaxial layer 202n. The sinker 204n partitions a region R1 off from the epitaxial layer 202n, and the well region 214 is located in the region R1. In addition, the interconnects 240 are formed in the dielectric layer 212 and electrically connect with the sinker 204n. The active device A1 is located within the well region 214p. The doped region 226p of the active device A1 has the first type conductivity, and the doped regions 228n, 230n and 232n have the second type conductivity, wherein the doped regions 228n, 230n and 232n form respective source, drain and drift region of the active device A1. The doped regions 228n and 230n are located in the well region 214 at opposite sides of the gate 220 respectively, and the doped region 230n is located within the doped region 232n. Furthermore, the interconnects 234, 238 and 236 are formed in the dielectric layer 212, and electrically connect with the doped region 230n, the gate 220, and the doped regions 228n and 226p, respectively.

The first buried layer 206p has the first type conductivity, and is formed between the region R1 and the substrate 200. The first buried layer 206p connects, for example, with the well region 214p. The second buried layer 208n has the second type conductivity, and is formed between the first buried layer 206p and the substrate 200. The second buried layer 208n connects with the sinker 204n. The first buried layer 206p and the second buried layer 208n are, for example, heavily doped regions, wherein a doping concentration of the first buried layer 206p is, for example, greater than that of the substrate 200, and a doping concentration of the second buried layer 208n is, for example, greater than that of the epitaxial layer 202n. Due to the provision of the first buried layer 206p and the second buried layer 208n, the input voltage of the active device A1 will not be totally applied to the substrate 200, thereby widening the allowable input voltage range. For example, if an input voltage is applied to the interconnect 234, the first buried layer 206p and the second buried layer 208n can prevent a breakdown from occurring at the interface between the epitaxial layer 202n and the substrate 200. In addition, if the interconnect 234 is applied with a high voltage, the potential of the interconnect 240 is, for example, lower than that of the interconnect 234, and higher than that of the interconnect 236. Therefore, the high voltage can be directly applied to the interconnect 240 to thereby further prevent the breakdown from occurring at the interface between the epitaxial layer 202n and the substrate 200. Thus, the voltage applied to the interconnect 234 can have a wider allowable range. Apparently, a voltage applied to the interconnect 236 may also have a wider allowable range. Thereby, the sinker 204n, the first buried layer 206p and the second buried layer 208n can prevent the voltage applied to the active device A1 from interfering with other semiconductor devices on the substrate 200. The sinker 204n, the first buried layer 206p and the second buried layer 208n can also prevent the active device A1 from being interfered with other semiconductor devices on the substrate 200. Therefore, the active device A1 will not cause latch-up of the other semiconductor devices.

In addition, the semiconductor device may include a third buried layer 215p of the first type conductivity. The third buried layer 215p is formed between the second buried layer 208n and the substrate 200. The third buried layer 215p is, for example, a heavily doped region, with a doping concentration being, for example, greater than that of the substrate 200. In fabricating the semiconductor device, the third buried layer 215 and the first buried layer 206p are, for example, formed at the same time.

In another aspect, the semiconductor device may also include a junction isolation structure of the first type conductivity. The junction isolation structure isolates the semiconductor device from other semiconductor devices on the substrate 200. In this embodiment, the junction isolation structure consists of, for example, another buried layer 216p and another well region 218p. The buried layer 216p extends from the substrate 200 to the epitaxial layer 202n, and the well region 218p extends from the buried layer 216p to the upper surface of the epitaxial layer 202n. In fabricating the semiconductor device, the buried layer 216p and the first buried layer 205p are, for example, formed at the same time, and the well region 218p and the well region 214p are, for example, formed at the same time.

Taking a complementary metal-oxide-semiconductor field effect transistor (hereinafter referred to as CMOSFET) as an example, the latch-up prevention function of the semiconductor device will be described as follows.

Second Embodiment

Figure 3:
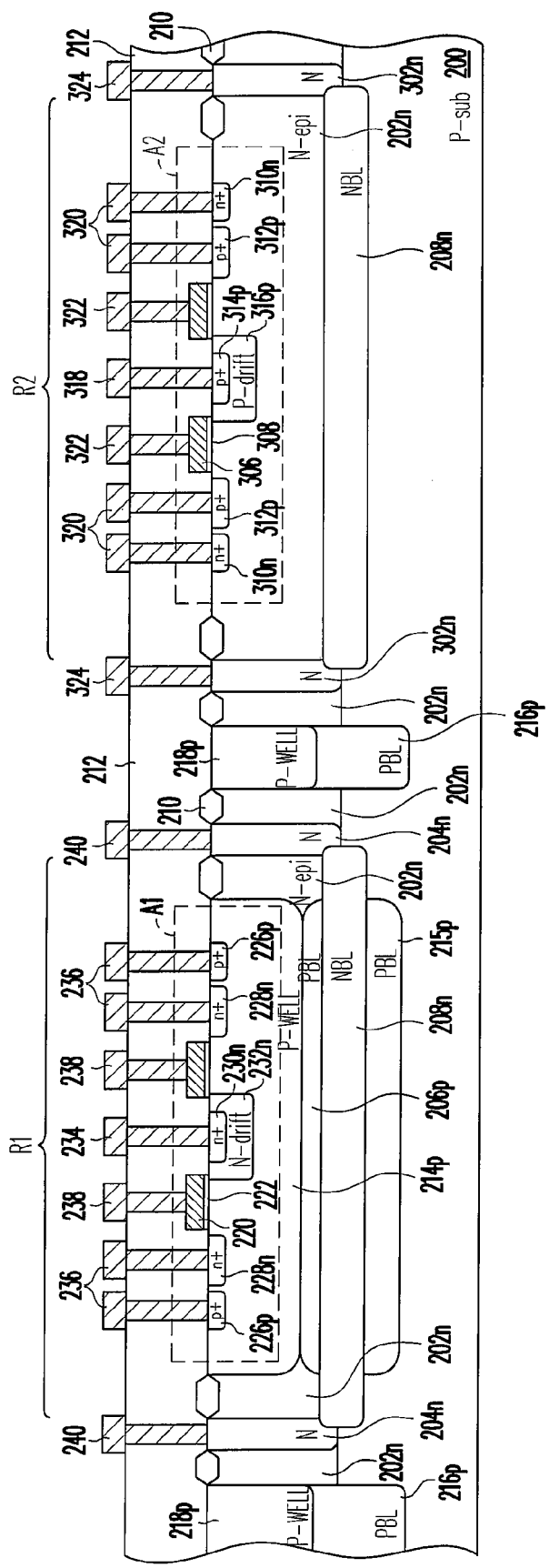
FIG. 3 is a cross-sectional view of a complementary metal-oxide-semiconductor field effect transistor in accordance with a second embodiment of the present invention.

FIG. 3 is a cross-sectional view of a CMOSFET in accordance with a second embodiment of the present invention. For the sake of simplicity, only the differences between the second and first embodiments are described herein.

Referring to FIG. 3, the CMOSFET includes a first transistor and a second transistor A2. In this embodiment, the first transistor is the active device A1 as described in the first embodiment, and is, for example, a high voltage MOSFET. The second transistor A2 is, for example, also a high voltage MOSFET, but the present invention is not limited to the particular embodiment disclosed herein. In other words, the first transistor and the second transistor A2 may be any kind of MOSFET. In this embodiment, the CMOSFET further includes interconnects 318, 320, 322 and 324 formed in the dielectric layer 212, but the present invention is not limited to the particular embodiment disclosed herein.

The CMOSFET further includes a sinker 302n of the second type conductivity. The sinker 302n is formed in the epitaxial layer 202n. The sinker 302n extends from the substrate 200 to the upper surface of the epitaxial layer 202n, and partitions a region R2 off from the epitaxial layer 202n outside the region R1. The interconnect 324 electrically connects with the sinker 302n. The second transistor A2 is located within the region R2. The second transistor A2 includes a gate 306, a gate dielectric layer 308, and doped regions 310n, 312p, 314p and 316p. The doped regions 312p, 314p and 316p form respective source, drain and drift region of the second transistor A2. The doped region 310n has the second type conductivity, and the doped regions 312p, 314p and 316p have the first type conductivity. The doped regions 312p and 314p are located in the epitaxial layer 202n at opposite two sides of the gate 306, and the doped region 314p is located within the doped region 316p. In this embodiment, the doped region 316p is represented by label "P-drift". In addition, the interconnects 318, 322 and 320 electrically connect with the doped region 314p, gate 306, and doped regions 310n and 312p, respectively.

The second buried layer 208n is further located between the region R2 and the substrate 200. The second buried layer 208n between the region R2 and the substrate 200 connects with the sinker 302n. Due to the provision of the sinkers 204n, 302n, the first buried layer 206p and the second buried layer 208n, the structure of a parasitic diode formed by the doped region 312p, the epitaxial layer 202p, the substrate 200 and the doped region 228 is changed, thereby preventing latch-up phenomenon. In addition, the doped region 312p, the epitaxial layer 202n and the substrate 200 form respective emitter, base and collector of a parasitic bipolar transistor, and the doped region 228n, the substrate 200 and the epitaxial layer 202n form respective emitter, base and collector of another parasitic bipolar transistor. Furthermore, according to the foregoing description, the first buried layer 206p and the second buried layer 208n may be heavily doped regions, and therefore increase the doping concentration of the base, thereby decreasing a current gain of the bipolar transistor. Moreover, by adjusting potential of the interconnects 240 and 324, the current gain may be changed to thereby further prevent latch-up phenomenon. In another aspect, the voltage applied to the second transistor A2 can have a wider allowable range. For example, if a high input voltage is applied to the interconnect 320, since the potential of the interconnect 324 can be changed, the high input voltage may be directly applied to the interconnect 324. This can avoid direct application of the input voltage to the substrate 200, thereby further preventing a breakdown from occurring at the interface between the epitaxial layer 202n and the substrate 200. Therefore, the voltage applied to the interconnect 320 can have a wider allowable range. Apparently, the voltage applied to the interconnect 318 may also have a wider allowable range. In addition, due to the provision of the sinker 302n and the second buried layer 208n, the second transistor A2 and other semiconductor devices on the substrate 200 can be effectively isolated from each other.

In summary, the present invention can prevent latch-up of the CMOSFET, widen input voltage range, and provide isolation from other semiconductor devices on the substrate. In addition, the sinker occupies only a very small portion of the available substrate area, and the buried layer is located beneath the active device, the present invention can therefore meet the high integration requirement.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A complementary metal-oxide-semiconductor field effect transistor comprising:
   a substrate of a first type conductivity;
   an epitaxial layer of a second type conductivity and located on the substrate;
   a first sinker of the second type conductivity, the first sinker being located in the epitaxial layer, and extending from the substrate to an upper surface of the epitaxial layer, the first sinker partitioning a first region off from the epitaxial layer;
   a second sinker of the second type conductivity, the second sinker being located in the epitaxial layer, and extending from the substrate to the upper surface of the epitaxial layer, the second sinker partitioning a second region off from the epitaxial layer outside the first region;
   a well region of the first type conductivity, the well region being located in the first region;
   a first high voltage metal-oxide-semiconductor field effect transistor (HVMOSFET) located in the well region;
   a second high voltage metal-oxide-semiconductor field effect transistor (HVMOSFET) located in the second region;
   a first buried layer of the first type conductivity, the first buried layer being located between the first region and the substrate; and
   a second buried layer of the second type conductivity, the second buried layer being located between the first buried layer and the substrate, and between the second region and the substrate, the second buried layer between the first buried layer and the substrate connecting with the first sinker, and the second buried layer between the second region and the substrate connecting with the second sinker.

2. The complementary metal-oxide-semiconductor field effect transistor according to claim 1, further comprising a third buried layer of the first type conductivity, the third buried layer being located below the first buried layer, and between the second buried layer and the substrate.

3. The complementary metal-oxide-semiconductor field effect transistor according to claim 2, wherein a doping concentration of the third buried layer is greater than that of the substrate.

4. The complementary metal-oxide-semiconductor field effect transistor according to claim 1, wherein a doping concentration of the first buried layer is greater than that of the substrate.

5. The complementary metal-oxide-semiconductor field effect transistor according to claim 1, wherein the first conductivity type is P-type, and the second conductivity type is N-type.

6. The complementary metal-oxide-semiconductor field effect transistor according to claim 1, wherein the first conductivity type is N-type, and the second conductivity type is P-type.

* * * * *